US006284666B1

United States Patent
Naeem et al.

(10) Patent No.: US 6,284,666 B1
(45) Date of Patent: Sep. 4, 2001

(54) METHOD OF REDUCING RIE LAG FOR DEEP TRENCH SILICON ETCHING

(75) Inventors: Munir D. Naeem; Gangadhara S. Mathad, both of Poughkeepsie; Byeong Yeol Kim, Wappingers Falls; Stephan P. Kudelka, Fishkill; Brian S. Lee, New York, all of NY (US); Heon Lee, Sunnyvale, CA (US); Elizabeth Morales; Young-Jin Park, both of Poughkeepsie, NY (US); Rajiv M. Ranade, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/583,963

(22) Filed: May 31, 2000

(51) Int. Cl.$^7$ ............................................. H01L 21/302
(52) U.S. Cl. ........................... 438/713; 438/714; 438/733
(58) Field of Search ................................. 438/713, 714, 438/715, 732, 733, 734, 723; 216/17; 257/301

(56) References Cited

U.S. PATENT DOCUMENTS 4,994,406 * 2/1991 Vasquez et al. ....................... 437/67
5,409,563 * 4/1995 Cathey ................................. 156/643
5,891,807 * 4/1999 Muller et al. ........................ 438/713
5,909,044 * 6/1999 Chakravarti et al. ................ 257/301

* cited by examiner

Primary Examiner—Benjamin L. Utech
Assistant Examiner—Kin-Chan Chen
(74) Attorney, Agent, or Firm—H. Daniel Schnurmann

(57) ABSTRACT

A method of minimizing RIE lag (i.e., the neutral and ion fluxes at the bottom of a deep trench (DT) created during the construction of the trench opening using a side wall film deposition)) in DRAMs having a large aspect ratio (i.e., <30:1) is described. The method forms a passivation film to the extent necessary for preventing isotropic etching of the substrate, hence maintaining the required profile and the shape of the DT within the substrate. The RIE process described provides a partial DT etched into a substrate to achieve the predetermined depth. The passivation film is allowed to grow to a certain thickness still below the extent that it would close the opening of the deep trench. Alternatively, the passivation film is removed by a non-RIE etching process. The non-RIE process that removes the film can be wet etched with chemicals, such as hydrofluoric acid (buffered or non buffered) or, alternatively, using vapor phase and/or non-ionized chemicals, such as anhydrous hydrofluoric acid. The controlled thickness of the film allows achieving a predetermined DT depth for high aspect ratio structures.

13 Claims, 5 Drawing Sheets

METHOD OF REDUCING RIE LAG FOR DEEP TRENCH SILICON ETCHING

FIELD OF INVENTION

The present invention is related to the fabrication of semiconductor devices, and more particularly, to etching a high aspect ratio deep trench DRAM to build capacitors in Si substrates.

BACKGROUND OF THE INVENTION

The fabrication of deep trenches (DT) in Si substrates is one method of making charge storage cells, referred to as DT capacitors. A deep hole of somewhat conical shape is etched out of a Si substrate wafer by a commonly used dry etch method known as reactive ion etching (RIE). A dielectric material usually with a high dielectric constant is deposited in a form of a conformal layer inside a DT. The inner surface on one side of the trench, and a conductive or a semiconductor material fill on the other side of the dielectric material serve as capacitor plates. The film thickness of the dielectric material is inversely proportional to the charge the film can hold. Thus, the thickness of the film is kept to a minimum to the extent allowed by the process capability. The surface area of the dielectric film is directly proportional to the charge holding capacity, also known as capacitance. Accordingly, the capacitance of the device depends on the inner surface area of the DT etched in Si.

There is today an ever increasing need to make the DT smaller to conserve space on the substrate and, hence, to increase productivity. This reduction process is known to practitioners in the art as ground rule (GR) shrinking. The direct result of GR shrinkage is that the circumference or the perimeter of the DT ends up substantially reduced. In order to maintain the capacitance requirements of the DT capacitor, its depth must be constantly increased. Such a situation leads to a high aspect ratio, which is defined as the ratio of the depth of the etched structure relative to its width (i.e., if in a planar view, the structure is square or rectangular) or to its diameter (i.e., if in a planar view the structure is circular or elliptical in shape).

The etch process in general, and RIE process in particular, are heavily dependent on the aspect ratio of the structure. A typical RIE process used for etching generally involves the deposition of oxide ($SiO_2$) or nitride ($Si_3N_4$) films used as a hard mask. A photolithography process is then employed to open holes in the hard mask. In subsequent steps, the holes are etched in the Si substrate to form the DT. The process of forming DT's using RIE is well known in the art, and is described, e.g., in U.S. Pat. No. 4,784,720; 5,409,563; 5,501,893; 5,605,600 and 5,409,563.

The DT Si RIE process is relatively complex. Etching is performed in equipment wherein gaseous species, usually containing $Cl_2$, F and Br, are ionized. Etching is achieved by a combination of several mechanisms such as ion bombardment, ion assisted chemical etching and chemical etching (dominated by radicals). The profile and shape control of DT is very important for other process reasons. The RIE process which is, essentially, a controlled way of deposition and etching are tailored to control the profile and prevent the isotropic etching. This objective is achieved by controlling the formation of deposition called passivation and its etching.

The role of passivation in DT etching and profile has been described by Muller et al. in the aforementioned U.S. Pat. No. 5,605,600, wherein the effect of substrate temperature on the formation of passivation is described in full detail.

The process of high aspect ration etching is also described by Cathey in the previously mentioned U.S. Pat. No. 5,409,563.

With the requirement of GR shrinkage, the control of DT side wall (SW) passivation has become a fundamental issue and an impediment in achieving deeper DTs. As shown in FIG. 1, nitride (20) and oxide (30) films are conventionally deposited on a Si substrate 10. The processes of lithography follows, and a hard mask consisting of films 20 and 30 is etched. After etching the hard mask, Si etching is performed and DT 40 is etched in the substrate. The process involves the formation of a passivation layer 50. Known in the prior art is the fact that the process is designed in such a manner that the controlled growth of passivation layer 50 prevents isotropic etching to help control the DT profile. On average, the thickness of film 50 ranges from 20 to 40 nm in a conventional processes described in prior art. However, the presence of a thick passivation layer 50 on the entire inner surface of DT 40 during an etch process leads to a significantly slower Si etch rate. This event can be attributed to the aspect ratio which, typically, can exceed 45. The aspect ratio dependent (ARD) slowdown of the Si etch rate is called RIE lag. One reason is that the thickness of film 50 continues to grow on each side of the DT 40, leading to a further narrowing of the DT. The films 50 grow to the extent that they eventually join each other, blocking the passage of etch species into the DT and the removal of etch byproducts from the DT. This blockage is significant for smaller GR etch process in standard semiconductor manufacturing processes.

The aforementioned problem finds its way in many instances, e.g., during the construction of certain classes of semiconductor devices, such as DRAMs (dynamic random access memory) which typically use two types of capacitors to store charges: i) capacitors formed in deep trench holes in crystalline silicon and ii) stacked capacitors. The important device parameter in these memory devices is the capacitance value of the memory cell. Higher values are preferred to increase the charge retention time in these cells. In the case of trench capacitor based devices, the capacitance value of a cell is proportional to the trench wall area, which in turn depends linearly upon the trench depth for a given trench opening dimension. As previously described, achieving large trench depths is therefore of utmost importance to fabricating robust memory cells having large retention time.

The etching of trenches is normally performed in a complex plasma consisting of several gas mixtures. Silicon etching in these plasmas is by the reaction of neutral species, such as F, Br or other halogens, enhanced by ion activation of the silicon surface. High etch rates are achievable only if adequate neutral and ion flux as well as high ion energies are available at the etching front. Etching deep or high aspect ratio trench holes is therefore plagued by physical laws: the flux of neutral and ionic species at the bottom surface of the trench decreases with increase in depth or aspect ratio (AR) and the ion energy decreases at larger depths due to inelastic scattering of ions on trench walls. The reduction of etch rate results render the etching of deep trenches very difficult. This effect is generally called RIE lag or aspect ratio dependent etching (ARDE). Reduction of the RIE lag is important for achieving deep trenches with high etch rates.

The second factor in trench etching is anisotropy of the etched profiles. Because of close placement of trenches in a silicon chip of high memory density, it is necessary for the trench profiles to be near-vertical to prevent the merging of adjacent trench walls. Since some halogen species (e.g., F) in the plasma tend to etch silicon with high degree of isotropy, some type of sidewall passivation is needed to prevent lateral etching of silicon, particularly when F-containing gases (e.g., $NF_3$, $SF_6$) are used. The control of this passivation film becomes more critical if high AR trenches are to be achieved. In some processes in the literature, deposition of side wall passivation film is done by adding gases like oxygen to the etching plasma.

OBJECTS OF THE INVENTION

Accordingly, it is a primary object of the invention to provide a method of eliminating or at least minimizing RIE lag during the manufacture of DTs in DRAM devices or similar memory structures having a large aspect ratio (i.e., >30:1).

It is another object of the invention to provide an etching process that prevents the formation of a side wall film to an extent where it hinders further removal of material from a DT.

It is yet another object of the invention to provide a process of forming a film to an extent that is necessary to prevent isotropic etching of a substrate, hence maintaining the required profile and the shape of a DT within a semiconductor substrate.

It is still another object of the invention to provide a method of using RIE and wet etching in an alternate process referred to as cyclic etch process, wherein a controlled thickness of a film is maintained to achieve a predetermined DT depth for high aspect ratio structures.

It is a further object of the invention to reduce the neutral and ion fluxes at the trench bottom created during the construction of a trench opening using a side wall film deposition It is still a further object of the invention to enhance the capacitance of a DRAM cell by etching deeper trenches

SUMMARY OF THE INVENTION

In one aspect of the invention, there is provided a RIE process wherein a partial DT is etched into a substrate to achieve a predetermined DT depth 60. A film is allowed to grow to a certain thickness still below the extent that would close the opening of the deep trench.

In another aspect of the invention, a passivation film is then removed by a non-RIE etching process. The non-RIE process to remove this film can be wet etched with chemicals such as hydrofluoric acid (buffered or non buffered) or, alternatively, vapor phase, non-ionized chemicals, such as anhydrous hydrofluoric acid.

In yet another aspect of the invention, the DT having a desired depth is exposed to a passivation build up process within an RIE or oxidation process so that a thin film is built up ensuring that the opening passage to the trench is not blocked any further or at the very least, minimally blocked. The processing conditions of this step are such that the build up of the film is uniform in the interior of DT to the extent of its depth. This step is referred to as in-situ passivation build up and is carried out to prevent further lateral or isotropic etch of the DT during the following etching step.

In still another aspect of the invention, a further RIE process is carried out to increase the depth of the DT. In this process, an inventive step is employed wherein the film is etched away at the bottom of the DT. This allows the etching of the substrate, preferably Si, only in a vertical direction to increase the DT depth further and prevent anisotropic etching. The DT depth is increased to 90 substantially by repeating the aforementioned process in a cyclic fashion, i.e., i) RIE or dry etch; ii) wet or non-ionized vapor phase passivation removal; iii) in-situ passivation formation; and iv) break through and further RIE etch of deep trenches.

Accordingly, it is provided a method of etching high aspect ratio trenches in a semiconductor device that includes the the steps of: 1) depositing a hardmask on a substrate; 2) patterning the hardmask; 3) using the hardmask, etching the substrate with a substantially directional etch process to form a trench, the etch process resulting in a deposition of a passivation layer interior to the trench; and 4) repeatedly etching the substrate: a) under varied process conditions to partially remove the passivation layer, partially in-situ or ex-situ regrowth (deposition) of the passivation , and b) with the substantially directional etch process, such that the etching etches the trench to a desired aspect ratio.

BRIEF DESCRIPTION OF THE DRAWINGS

The foregoing and other aspects, and advantages of the present invention will be better understood from the following detailed description of the invention when taken in conjunction with the accompanying drawings, in which:.

DETAILED DESCRIPTION OF THE INVENTION.

Referring back to the primary object of the invention referring to the RIE lag defined as neutral and ion fluxes at the trench bottom due to the constriction of the trench opening by side wall film deposition, it is known that since the thickness of the side wall film is time dependant, thereby affecting the trench depth, etching deeper trenches aggravates this problem. Since most of the trenches so far have been of smaller aspect ratio (<5:1), the proposed solution has not been so far disclosed. The main contributors limiting DT depth are, therefore, the ion-neutral fluxes and the time dependent formation of side wall passivation.

The uncovering of this second contributor has led to inventing a solution that minimizes or eliminates the RIE lag problem, originating from this second factor. The process flow of the invention is shown below with each process step shown schematically in FIGS. 1–6 and is discussed in detail in the following steps 1–5.

In the preferred embodiment, the following process steps are used:

1. Native Oxide Breakthrough Process.

Figure 1:
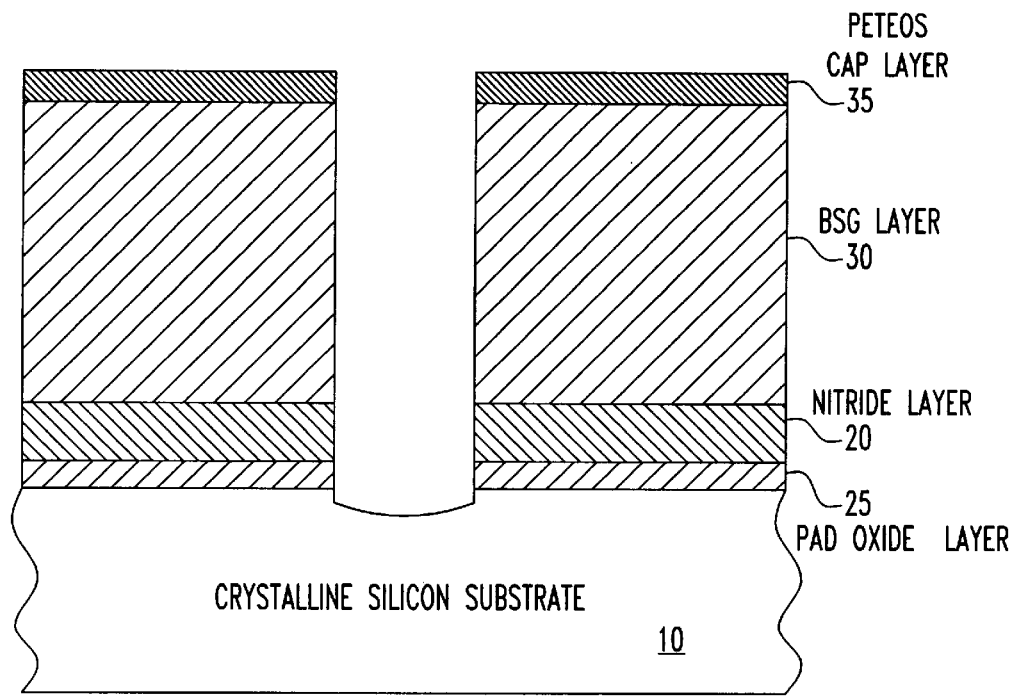
FIG. 1 shows a schematic diagram of a cross-section of a prior art patterned DT mask stack.
Figure 2:
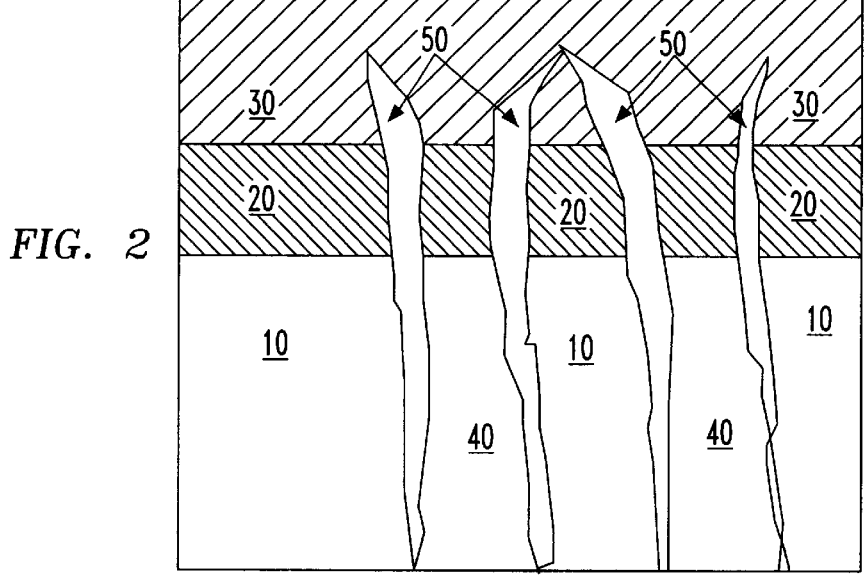
FIG. 2 shows a schematic diagram of a cross-section of a partially etched silicon DT in accordance with one embodiment of the present invention.

The wafer with patterned a hard mask stack (no resist is present at this time), shown in prior art FIG. 1, is placed in a plasma reactor facilitated with various gas lines and RF power supplies. The mask stack consists of a PETEOS (Plasma enhanced tetra-ethil-oxy-silicate) layer or some other similar cap oxide film 35, another doped oxide layer like BSG (Boro silicate glass) or BPSG (Boro phosphate silicate glass) film 30, a nitride film 20, and a thin pad oxide layer 25, all deposited on silicon substrate 10. The plasma used in this step consists of HBr, $NF_3$, and $O_2$ gas mixtures at less than 500 W RF power. The range of other process parameters are: wafer electrode temperature of 20–150 C., wafer backside helium pressure of 2–30 torr, reactor pressure of 20–300 mtorr, gas flows of 100–300 sccm HBr,4–25 sccm NF3,0–25 sccm $O_2$ or He—$O_2$ mixture. This process step etches any native oxide present on the surface of open silicon areas and prevents formation of micro masking which, if present would produce rough or grassy silicon surface during trench etching step 2. During this process, some of the silicon in the substrate may get etched.

2. Partial DT Etching Process.

Figure 3:
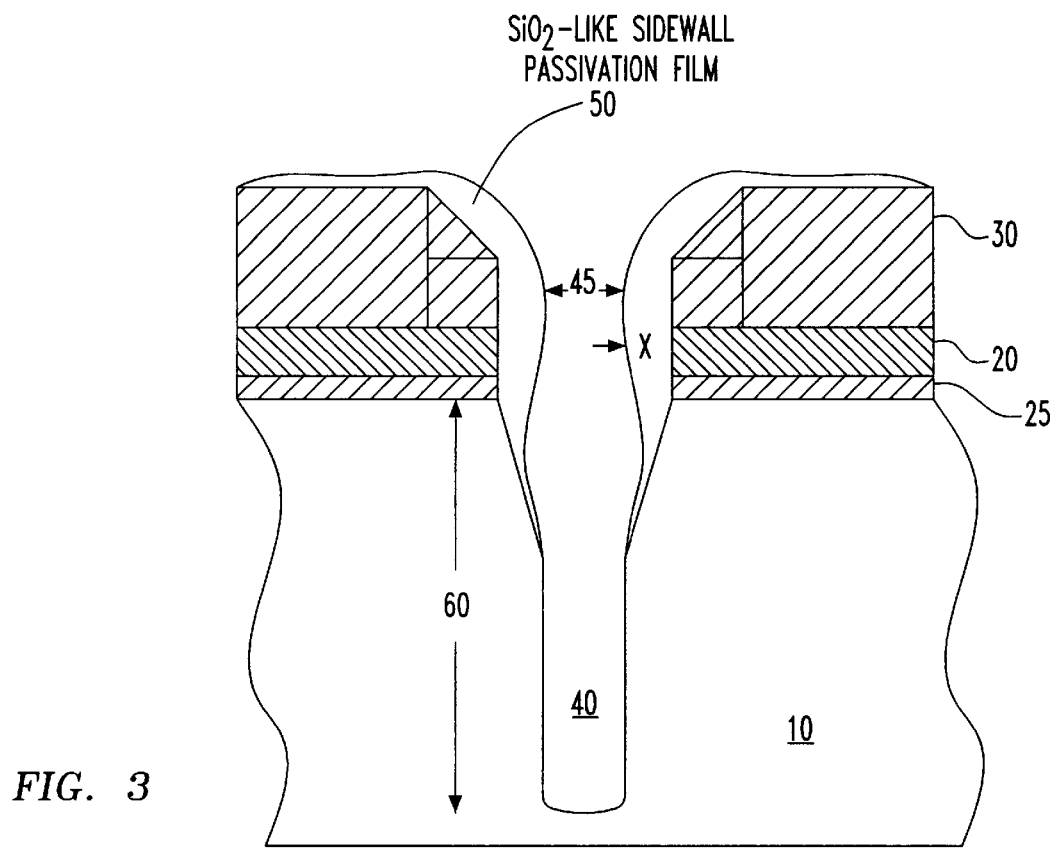
FIG. 3 is a schematic diagram of a cross-section of a DT with: i) a partially and ii) a completely removed $SiO_2$, such as a side wall passivation film using anhydrous HP vapor.

Referring now to FIG. 3, using the same reactor as in step 1 and with the wafer in place, the process is changed so that the RF power now is set in the range of 200–3000 watts. The remaining process parameters are set in the same range as in step 1. Silicon etching is completed when the depth 60 achieved is in the range of 20–50% of the final depth required. In a typical embodiment, the depth is 40% of the final depth. During this step, some deposit 50 is built up on the side walls of the trench 40, the thickness x being dependent on the etching time. The partially built up side wall deposit 50 is seen in FIG. 3, with the partially closed trench opening 45.

3. Wet or Anhydrous HF Vapor Removal of Sidewall Deposits.

Figure 4A:
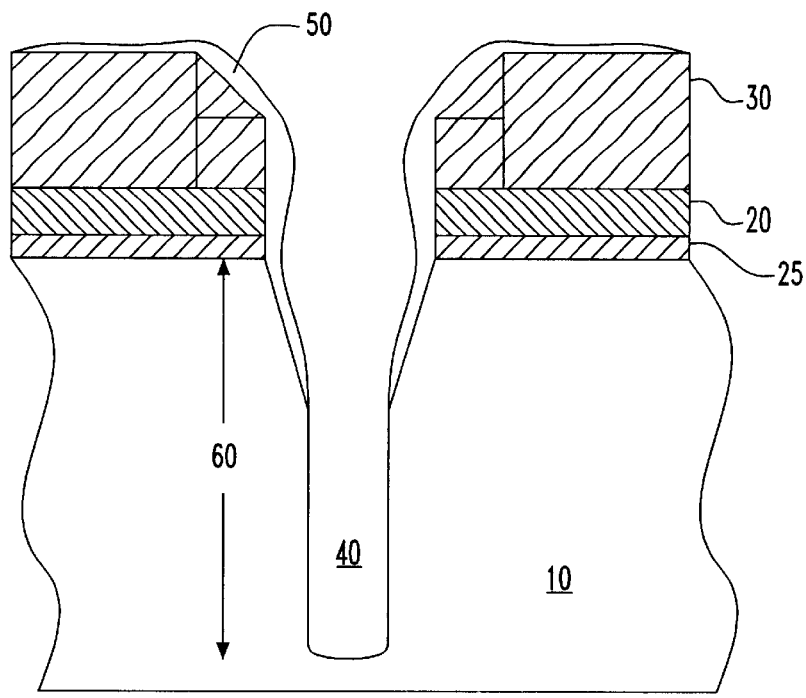
FIGS. 4a and 4b illustrates a schematic diagram of a cross-section of a DT after in-situ or ex-situ oxidation of a Si trench wall.
Figure 4B:
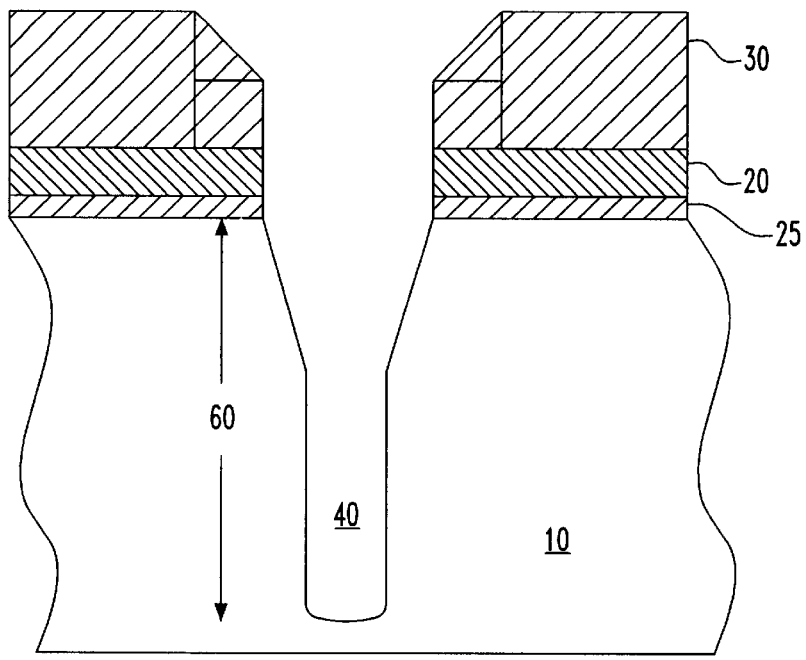

Referring now to FIGS. 4a and 4b, showing the trench after removal of the side wall film, the side wall deposit 50 formed in step 2 is now removed. Several alternate processes are possible. In the preferred embodiments, three processes can be alternatively used. In one embodiment, wet etching is used. The wafer is taken out of the plasma reactor and the wafer/s are immersed in a tank of buffered HF or similar etchants that can etch the side wall film 50. The concentration of the chemicals and the etching time is dependent upon the time of etching and process conditions used in step 2 and the thickness of deposit 50. Typical etching times are 10–60 sec in a solution of 10% solution of HF in water.

In another embodiment, anhydrous hydrofluoric acid (A-HF) vapor is used to remove the sidewall deposits 50. The wafer is taken out of the plasma reactor in step 2 and placed in a vapor reactor connected with A-HF gas supply. This reactor is typically operated at atmospheric pressure although it can also be operated under vacuum conditions. Typically, the wafer is first exposed to pure water vapor to change the surface condition of the wafer and then exposed to 30–50% of HF vapor for 5–50 sec. The platen on which the wafer is placed is kept at room temperature in this embodiment, although the HF vapor reaction can also be carried out at higher than room temperature.

In yet another embodiment, exposure of the wafer to A-HF vapor can be done in the same plasma reactor used in steps 1 and 2, except that no plasma is struck when using this part of the process. In this case, the HF and water vapor lines are directly connected to the reactor.

In another variation of the above embodiment, a vapor reactor can be incorporated on the same cluster platform as the plasma etching reactor of steps 1 and 2. After etching is completed as in steps 1 and 2, the wafer is moved, preferably, by way of a robot, to the vapor reactor and vapor etching is completed.

4. Trench Wall Plasma Oxidation.

Figure 5:
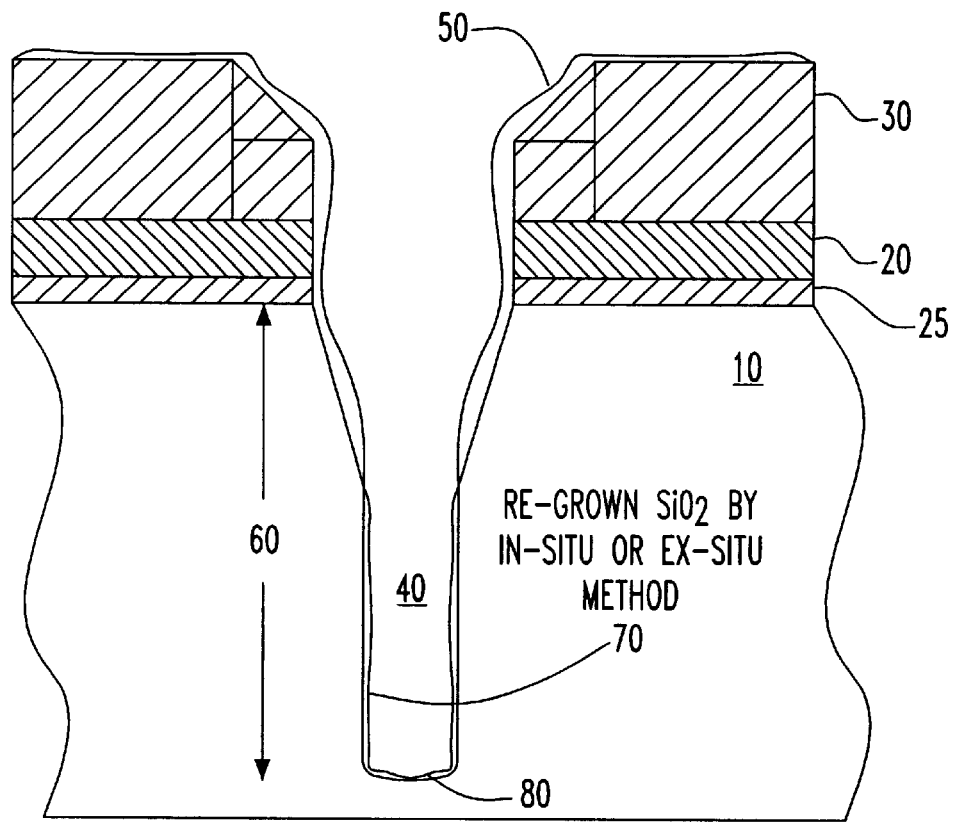
FIG. 5 shows a schematic of a cross-section of a fully etched trench using a combination of previously described process steps shown in FIGS. 2–4, with the sidewall deposit removed.

Referring now to FIG. 5, showing the DT with oxidized trench walls, after removal of side wall deposit in step 3, the wafer is then transported to either an oxidation furnace or to the plasma reactor of step 1 or 2. In one embodiment, the wafer is placed in the plasma reactor, where using an oxygen plasma the trench walls are slightly oxidized to build up a thin oxide film 70 on the exposed trench surfaces. The typical plasma oxidation conditions are: wafer electrode temperature of 20–150C, wafer backside helium pressure of 5–20 torr, reactor pressure of 25–250 mtorr, oxygen flow of 5–50 sccm, and RF power of 100–500 watt. Although oxygen is used as an oxidizing gas, other oxidizing gases like $NO_2$, $N_2+O_{2, He+o2}$ can be used.

5. Continuation of Trench Etching.

Depending upon where the oxidation step in step 4 is done, the wafer is transported either from the oxidation furnace to or left in the plasma etching reactor of step 1 or 2. Using the same or slightly modified process used in step 2, trench etching in silicon is continued either to completion or to another intermediate depth 90.

If etched to an intermediate depth, the process steps 2 through 4 are repeated to achieve even larger depths than that shown in FIG. 5.

Figure 6:
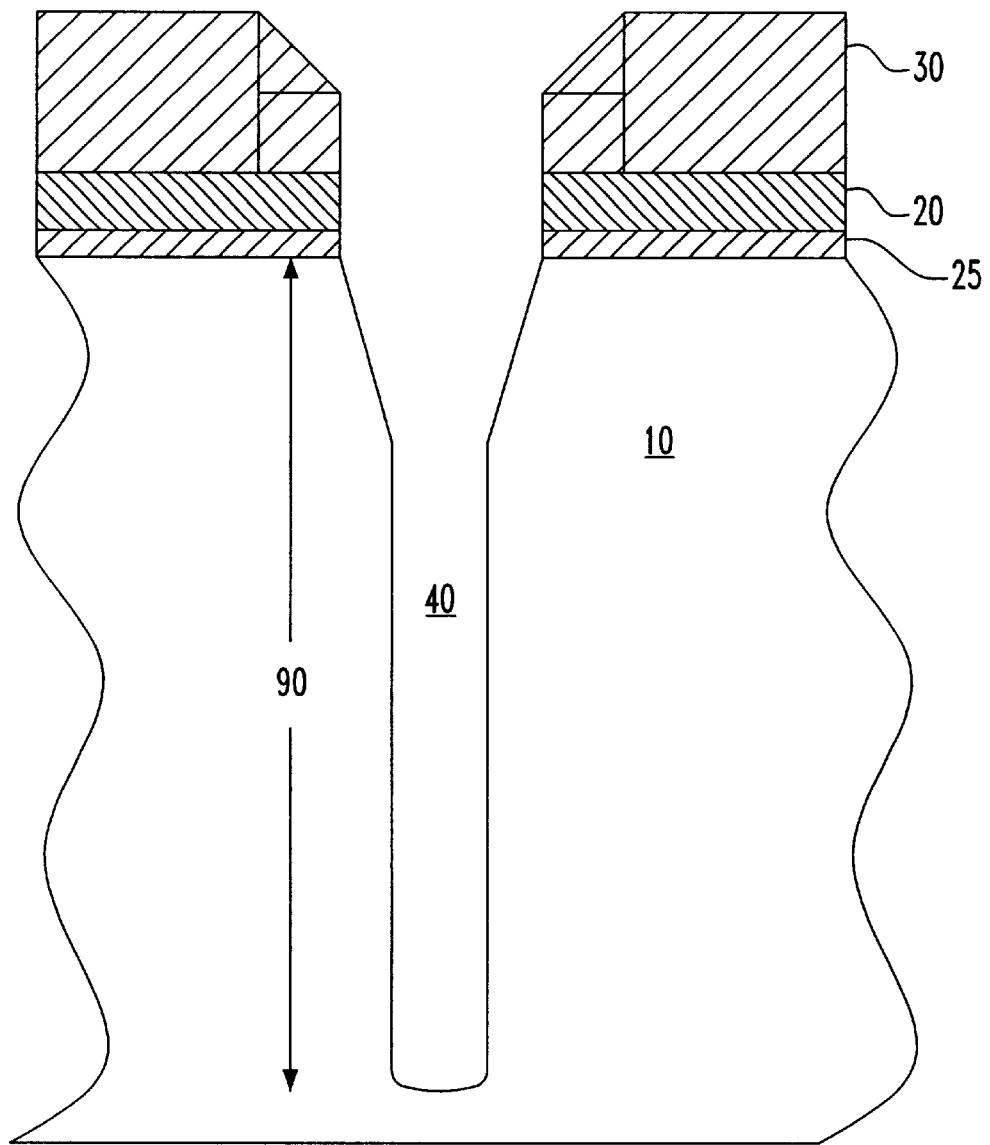
FIG. 6 illustrates an SEM view of a cross-section of a DT before removal of the side wall passivation film formed during DT etch together with various interface boundaries.

The final deep trench before wet etching the side wall film is shown in FIG. 5 and an SEM (Scanning Electron Microscope) is shown in FIG. 6.

While the invention has been described in terms of several embodiments, those skilled in the art will recognize that the invention can be practiced with changes and modifications within the spirit and scope of the appended claims.

Having thus described the invention, what is claimed as new and desired to secure by Letters Patent is as Follows:

1. A method of etching high aspect ratio trenches in a semiconductor device comprising the steps of:
   depositing a hardmask on a substrate;
   patterning said hardmask;
   using said hardmask, etching said substrate with a substantially directional etch process to form a trench, said etch process resulting in a deposition of a passivation layer interior to said trench; and
   repeatedly etching said substrate a) under varied process conditions to partially remove said passivation layer, and b) with said substantially directional etch process, such that said etching etches said trench to an aspect ratio.

2. The method as recited in claim 1, wherein said repeated etchings etches selected structures within said trench to overcome aspect ratio dependent physical limitations of said etching.

3. The method as recited in claim 1 wherein said successive etchings are further performed under a variety of etch chemistries such that said etching proceeds in a substantially vertical direction with a control of isotropic or lateral etch of said substrate.

4. The method as recited in claim 1, wherein said passivation layer is partially removed independently to prevent said passivation layer from growing and for preventing further etching of said trench.

5. The method as recited in claim 1, wherein said passivation layer is removed by wet etch or by etch with non-ionized or ionized vapors of an etchant to remove excessive build up of said passivation layer.

6. The method as recited in claim 1 further comprising the step of forming an thin in-situ passivation layer to prevent lateral or isotropic etch in subsequent etch steps.

7. The method as recited in claim 6 wherein subsequent etchings further increase the depth of the structure, said subsequent etchings being carried out by first removing said thin in-situ passivation layer.

8. The method as recited in claim 7 further comprising the step of removing material by etching in a vertical or an anisotropic direction.

9. The method as recited in claim 8, further comprising the steps of:
   a) etching said substrate to create a trench;
   b) forming said passivation layer on the sidewalls of said trench;
   c) partially removing said passivation layer;
   d) in-situ rebuilding of said passivation layer; and
   e) repeatedly etching until an aspect ratio of said trench is achieved.

10. The method as recited in claim 9, wherein said steps a) through d) are repeated in an alternating manner.

11. The method as recited in claim 10, wherein said repeated steps are performed in two process chambers in close proximity of each other.

12. The method as recited in claim 10 wherein said repeated steps in an alternating manner are performed in one process chamber.

13. The method as recited in claim 1 further comprising the step of forming a thin passivation layer ex-situ in a oxidation furnace.

* * * * *